United States Patent
Scanlan et al.

(10) Patent No.: US 9,466,545 B1
(45) Date of Patent: Oct. 11, 2016

(54) SEMICONDUCTOR PACKAGE IN PACKAGE

(75) Inventors: Christopher M. Scanlan, Chandler, AZ (US); Christopher J. Berry, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 1977 days.

(21) Appl. No.: 11/677,506

(22) Filed: Feb. 21, 2007

(51) Int. Cl.
*H01L 33/00* (2010.01)
*H01L 23/31* (2006.01)
*H01L 21/56* (2006.01)

(52) U.S. Cl.
CPC .......... *H01L 23/3135* (2013.01); *H01L 21/56* (2013.01)

(58) Field of Classification Search
CPC ................. H01L 23/3135; H01L 2924/15153
See application file for complete search history.

(56) References Cited

U.S. PATENT DOCUMENTS

| | | |
|---|---|---|
| 4,398,235 A | 8/1983 | Lutz et al. |
| 4,530,152 A | 7/1985 | Roche et al. |
| 4,567,643 A | 2/1986 | Droguet et al. |
| 4,707,724 A | 11/1987 | Suzuki et al. |
| 4,729,061 A | 3/1988 | Brown |
| 4,730,232 A | 3/1988 | Lindberg |
| 4,756,080 A | 7/1988 | Thorp, Jr. et al. |
| 4,763,188 A | 8/1988 | Johnson |
| 4,982,265 A | 1/1991 | Watanabe et al. |
| 4,996,587 A | 2/1991 | Hinrichsmeyer et al. |
| 5,012,323 A | 4/1991 | Farnworth |
| 5,025,306 A | 6/1991 | Johnson et al. |
| 5,040,052 A | 8/1991 | McDavid |
| 5,087,961 A * | 2/1992 | Long et al. ............ 257/701 |
| 5,138,438 A | 8/1992 | Masayuki et al. |
| 5,140,404 A | 8/1992 | Fogal et al. |
| 5,157,480 A | 10/1992 | McShane et al. |
| 5,165,067 A | 11/1992 | Wakefield et al. |
| 5,198,888 A | 3/1993 | Sugano et al. |
| 5,200,362 A | 4/1993 | Lin et al. |
| 5,229,647 A | 7/1993 | Gnadinger |
| 5,241,133 A | 8/1993 | Mullen, III et al. |
| 5,273,938 A | 12/1993 | Lin et al. |
| 5,291,061 A | 3/1994 | Ball |
| 5,323,060 A | 6/1994 | Fogal et al. |
| 5,334,875 A | 8/1994 | Sugano et al. |
| 5,347,429 A | 9/1994 | Kohno et al. |
| 5,355,283 A * | 10/1994 | Marrs et al. ............ 361/760 |
| 5,394,010 A | 2/1995 | Tazawa et al. |

(Continued)

FOREIGN PATENT DOCUMENTS

| | | |
|---|---|---|
| JP | 54128274 | 10/1979 |
| JP | 56062351 | 5/1981 |

(Continued)

*Primary Examiner* — David E Graybill
(74) *Attorney, Agent, or Firm* — Kevin B. Jackson

(57) ABSTRACT

A semiconductor package having a second semiconductor package or module integrated therein. The semiconductor package of the present invention typically comprises active and passive devices which are each electrically connected to an underlying substrate. The substrate is configured to place such active and passive devices into electrical communication with contacts of the substrate disposed on a surface thereof opposite that to which the active and passive devices are mounted. The module of the semiconductor package resides within a complimentary opening disposed within the substrate thereof. The module and the active and passive devices of the semiconductor package are each fully or at least partially covered by a package body of the semiconductor package.

19 Claims, 6 Drawing Sheets

(56) References Cited

U.S. PATENT DOCUMENTS

| | | |
|---|---|---|
| 5,422,435 A | 6/1995 | Takiar et al. |
| 5,426,563 A | 6/1995 | Moresco et al. |
| 5,432,729 A | 7/1995 | Carson et al. |
| 5,438,224 A | 8/1995 | Papageorge et al. |
| 5,463,253 A | 10/1995 | Waki et al. |
| 5,473,196 A | 12/1995 | De Givry |
| 5,474,957 A | 12/1995 | Urushima |
| 5,474,958 A | 12/1995 | Djennas et al. |
| 5,491,612 A | 2/1996 | Nicewarner, Jr. |
| 5,495,394 A | 2/1996 | Kornfeld et al. |
| 5,495,398 A | 2/1996 | Takiar et al. |
| 5,502,289 A | 3/1996 | Takiar et al. |
| 5,514,907 A | 5/1996 | Moshayedi |
| 5,519,936 A * | 5/1996 | Andros et al. ................ 29/840 |
| 5,541,450 A | 7/1996 | Jones et al. |
| 5,545,922 A | 8/1996 | Golwalkar et al. |
| 5,569,625 A | 10/1996 | Yoneda et al. |
| 5,581,498 A | 12/1996 | Ludwig et al. |
| 5,583,378 A | 12/1996 | Marrs et al. |
| 5,587,341 A | 12/1996 | Masayuki et al. |
| 5,594,275 A | 1/1997 | Kwon et al. |
| 5,602,059 A | 2/1997 | Horiuchi et al. |
| 5,604,376 A | 2/1997 | Hamburgen et al. |
| 5,608,262 A * | 3/1997 | Degani et al. ................ 257/723 |
| 5,614,766 A | 3/1997 | Takasu et al. |
| 5,620,928 A | 4/1997 | Lee et al. |
| 5,625,221 A | 4/1997 | Kim et al. |
| 5,637,536 A | 6/1997 | Val |
| 5,637,912 A | 6/1997 | Cockerill et al. |
| 5,640,047 A | 6/1997 | Nakashima |
| 5,646,828 A | 7/1997 | Degani et al. |
| 5,650,593 A | 7/1997 | McMillan et al. |
| 5,652,185 A | 7/1997 | Lee |
| 5,668,405 A | 9/1997 | Yamashita |
| 5,677,569 A | 10/1997 | Choi et al. |
| 5,682,062 A | 10/1997 | Gaul |
| 5,689,135 A | 11/1997 | Ball |
| 5,696,031 A | 12/1997 | Wark |
| 5,696,666 A | 12/1997 | Miles et al. |
| 5,715,147 A | 2/1998 | Nagano |
| 5,721,452 A | 2/1998 | Fogal et al. |
| 5,723,900 A | 3/1998 | Kojima et al. |
| 5,729,051 A | 3/1998 | Nakamura |
| 5,739,581 A | 4/1998 | Chillara et al. |
| 5,739,585 A | 4/1998 | Akram et al. |
| 5,744,827 A | 4/1998 | Jeong et al. |
| 5,747,875 A * | 5/1998 | Oshima ................ 257/687 |
| 5,760,471 A | 6/1998 | Fujisawa et al. |
| 5,763,939 A | 6/1998 | Yamashita |
| 5,767,528 A | 6/1998 | Sumi et al. |
| 5,777,387 A | 7/1998 | Yamashita et al. |
| 5,783,870 A | 7/1998 | Mostafazadeh et al. |
| 5,786,239 A | 7/1998 | Ohsawa et al. |
| 5,793,108 A | 8/1998 | Nakanishi et al. |
| 5,793,118 A * | 8/1998 | Nakajima ................ 257/790 |
| 5,798,014 A | 8/1998 | Weber |
| 5,801,439 A | 9/1998 | Fujisawa et al. |
| 5,815,372 A | 9/1998 | Gallas |
| 5,819,398 A | 10/1998 | Wakefield |
| 5,835,355 A | 11/1998 | Dordi |
| 5,835,988 A | 11/1998 | Ishii |
| 5,854,741 A | 12/1998 | Shim et al. |
| 5,859,471 A | 1/1999 | Kuraishi et al. |
| 5,861,666 A | 1/1999 | Bellaar |
| 5,866,949 A | 2/1999 | Schueller |
| 5,872,025 A | 2/1999 | Cronin et al. |
| 5,883,426 A | 3/1999 | Tokuno et al. |
| 5,885,849 A | 3/1999 | DiStefano et al. |
| 5,886,412 A | 3/1999 | Fogal et al. |
| 5,894,108 A | 4/1999 | Mostafazadeh et al. |
| 5,895,965 A | 4/1999 | Tanaka et al. |
| 5,903,049 A | 5/1999 | Mori |
| 5,903,052 A | 5/1999 | Chen et al. |
| 5,909,633 A | 6/1999 | Haji et al. |
| 5,917,242 A | 6/1999 | Ball |
| 5,930,599 A | 7/1999 | Fujimoto et al. |
| 5,949,654 A * | 9/1999 | Fukuoka ................ 361/760 |
| 5,952,611 A | 9/1999 | Eng et al. |
| 5,973,403 A | 10/1999 | Wark |
| 5,977,640 A | 11/1999 | Bertin et al. |
| 5,986,209 A | 11/1999 | Tandy |
| 6,001,671 A | 12/1999 | Fjelstad |
| 6,005,778 A | 12/1999 | Spielberger et al. |
| 6,013,948 A | 1/2000 | Ajkram et al. |
| 6,020,626 A * | 2/2000 | Ohsawa et al. ................ 257/668 |
| RE36,613 E | 3/2000 | Ball |
| 6,034,423 A | 3/2000 | Mostafazadeh et al. |
| 6,034,427 A | 3/2000 | Lan et al. |
| 6,051,886 A | 4/2000 | Fogal et al. |
| 6,057,598 A | 5/2000 | Payne et al. |
| 6,060,778 A | 5/2000 | Jeong et al. |
| 6,072,233 A | 6/2000 | Corisis et al. |
| 6,072,243 A | 6/2000 | Nakanishi |
| 6,074,898 A | 6/2000 | Ohsawa et al. |
| 6,080,264 A | 6/2000 | Ball |
| 6,093,970 A | 7/2000 | Ohsawa et al. |
| 6,097,089 A | 8/2000 | Gaku et al. |
| 6,100,804 A | 8/2000 | Brady et al. |
| 6,107,689 A | 8/2000 | Kozono |
| 6,111,324 A | 8/2000 | Sheppard et al. |
| 6,127,833 A | 10/2000 | Wu et al. |
| 6,133,637 A | 10/2000 | Hikita et al. |
| 6,144,571 A * | 11/2000 | Sasaki et al. ................ 363/144 |
| 6,160,705 A | 12/2000 | Stearns et al. |
| 6,172,419 B1 | 1/2001 | Kinsman |
| 6,180,696 B1 | 1/2001 | Wong et al. |
| 6,180,881 B1 | 1/2001 | Isaak |
| 6,184,463 B1 | 2/2001 | Panchou et al. |
| 6,214,641 B1 | 4/2001 | Akram |
| 6,228,676 B1 | 5/2001 | Glenn et al. |
| 6,235,554 B1 | 5/2001 | Akram et al. |
| 6,242,279 B1 | 6/2001 | Ho et al. |
| 6,257,857 B1 | 7/2001 | Lee et al. |
| 6,258,632 B1 | 7/2001 | Takebe |
| 6,261,869 B1 | 7/2001 | Radford et al. |
| 6,262,490 B1 | 7/2001 | Hsu et al. |
| 6,268,568 B1 | 7/2001 | Kim |
| 6,271,057 B1 | 8/2001 | Lee et al. |
| 6,274,404 B1 | 8/2001 | Hirasawa et al. |
| 6,277,672 B1 | 8/2001 | Ho |
| 6,288,905 B1 * | 9/2001 | Chung ................ 361/771 |
| 6,313,522 B1 | 11/2001 | Akram et al. |
| 6,326,696 B1 | 12/2001 | Horton et al. |
| 6,335,566 B1 * | 1/2002 | Hirashima et al. ............ 257/686 |
| 6,356,453 B1 * | 3/2002 | Juskey et al. ................ 361/760 |
| 6,369,444 B1 * | 4/2002 | Degani et al. ................ 257/724 |
| 6,395,578 B1 | 5/2002 | Shin et al. |
| 6,396,143 B1 | 5/2002 | Kimbara et al. |
| 6,399,418 B1 | 6/2002 | Glenn et al. |
| 6,404,046 B1 | 6/2002 | Glenn et al. |
| 6,414,396 B1 * | 7/2002 | Shim et al. ................ 257/778 |
| 6,448,506 B1 | 9/2002 | Glenn et al. |
| 6,452,278 B1 | 9/2002 | DiCaprio et al. |
| 6,459,148 B1 | 10/2002 | Chun-Jen et al. |
| 6,486,537 B1 | 11/2002 | Liebhard |
| 6,486,545 B1 * | 11/2002 | Glenn et al. ................ 257/686 |
| 6,489,669 B2 * | 12/2002 | Shimada et al. ............ 257/686 |
| 6,501,184 B1 | 12/2002 | Shin et al. |
| 6,507,098 B1 * | 1/2003 | Lo et al. ................ 257/686 |
| 6,515,356 B1 | 2/2003 | Shin et al. |
| 6,531,775 B1 | 3/2003 | Kobayashi et al. |
| 6,538,210 B2 * | 3/2003 | Sugaya et al. ................ 174/258 |
| 6,541,854 B2 | 4/2003 | Huang et al. |
| 6,546,620 B1 * | 4/2003 | Juskey et al. ................ 29/840 |
| 6,548,759 B1 * | 4/2003 | Glenn et al. ................ 174/557 |
| 6,564,454 B1 | 5/2003 | Glenn et al. |
| 6,576,998 B1 | 6/2003 | Hoffman |
| 6,577,013 B1 | 6/2003 | Glenn et al. |
| 6,586,824 B1 | 7/2003 | Glenn et al. |
| 6,677,672 B2 | 1/2004 | Knapp et al. |
| 6,693,362 B2 * | 2/2004 | Seyama et al. ................ 257/777 |
| 6,730,536 B1 * | 5/2004 | Glenn et al. ................ 438/57 |
| 6,731,015 B2 * | 5/2004 | Wu et al. ................ 257/796 |
| 6,762,488 B2 | 7/2004 | Maeda et al. |

(56) References Cited

U.S. PATENT DOCUMENTS

| | | | |
|---|---|---|---|
| 6,798,049 B1* | 9/2004 | Shin et al. | 257/678 |
| 6,798,063 B2 | 9/2004 | Kinsman | |
| 6,833,290 B2 | 12/2004 | Knapp et al. | |
| 6,838,761 B2 | 1/2005 | Karnezos | |
| 6,873,040 B2* | 3/2005 | Howard et al. | 257/691 |
| 6,906,415 B2* | 6/2005 | Jiang et al. | 257/723 |
| 6,906,416 B2* | 6/2005 | Karnezos | 257/723 |
| 6,921,968 B2* | 7/2005 | Chung | 257/686 |
| 6,933,598 B2* | 8/2005 | Karnezos | 257/686 |
| 6,936,922 B1 | 8/2005 | Park et al. | |
| 6,972,481 B2 | 12/2005 | Karnezos | |
| 7,008,822 B2 | 3/2006 | Bolken et al. | |
| 7,034,387 B2* | 4/2006 | Karnezos | 257/686 |
| 7,045,887 B2* | 5/2006 | Karnezos | 257/686 |
| 7,049,691 B2* | 5/2006 | Karnezos | 257/686 |
| 7,053,477 B2* | 5/2006 | Karnezos et al. | 257/686 |
| 7,057,269 B2* | 6/2006 | Karnezos | 257/686 |
| 7,061,088 B2* | 6/2006 | Karnezos | 257/686 |
| 7,064,426 B2* | 6/2006 | Karnezos | 257/686 |
| 7,101,731 B2* | 9/2006 | Karnezos | 438/107 |
| 7,109,410 B2* | 9/2006 | Arnold et al. | 174/390 |
| 7,163,842 B2* | 1/2007 | Karnezos | 438/108 |
| 7,166,494 B2* | 1/2007 | Karnezos | 438/108 |
| 7,169,642 B2* | 1/2007 | Karnezos | 438/108 |
| 7,180,169 B2* | 2/2007 | Ishimaru et al. | 257/690 |
| 7,198,980 B2* | 4/2007 | Jiang et al. | 438/107 |
| 7,239,164 B2* | 7/2007 | Tamaki | 257/686 |
| 7,247,519 B2* | 7/2007 | Karnezos et al. | 438/110 |
| 7,279,361 B2* | 10/2007 | Karnezos | 438/109 |
| 7,288,434 B2* | 10/2007 | Karnezos | 438/109 |
| 7,306,973 B2* | 12/2007 | Karnezos | 438/109 |
| 7,338,837 B2* | 3/2008 | Howard et al. | 438/109 |
| 7,358,115 B2* | 4/2008 | Karnezos | 438/107 |
| 7,364,946 B2* | 4/2008 | Karnezos | 438/109 |
| 7,368,319 B2* | 5/2008 | Ha et al. | 438/109 |
| 7,394,148 B2* | 7/2008 | Karnezos | 257/686 |
| 7,417,322 B2* | 8/2008 | Kang | 257/777 |
| 7,429,787 B2* | 9/2008 | Karnezos et al. | 257/686 |
| 7,501,697 B2* | 3/2009 | Yim et al. | 257/686 |
| 7,518,226 B2* | 4/2009 | Cablao et al. | 257/686 |
| 7,554,185 B2* | 6/2009 | Foong et al. | 257/686 |
| 7,554,194 B2* | 6/2009 | Kelly et al. | 257/713 |
| 7,573,136 B2* | 8/2009 | Jiang et al. | 257/777 |
| 7,629,681 B2* | 12/2009 | Zhao et al. | 257/701 |
| 7,633,765 B1* | 12/2009 | Scanlan et al. | 361/760 |
| 7,643,311 B2* | 1/2010 | Coffy | 361/818 |
| 7,687,897 B2* | 3/2010 | Ha et al. | 257/686 |
| 7,710,735 B2* | 5/2010 | Bae et al. | 361/735 |
| 7,772,683 B2* | 8/2010 | Jang et al. | 257/685 |
| 7,808,087 B2* | 10/2010 | Zhao et al. | 257/670 |
| 7,993,939 B2* | 8/2011 | Camacho et al. | 438/15 |
| 8,183,680 B2* | 5/2012 | Zhao et al. | 257/687 |
| 8,338,933 B2* | 12/2012 | Chen et al. | 257/686 |
| 2001/0030059 A1* | 10/2001 | Sugaya et al. | 174/256 |
| 2002/0047214 A1* | 4/2002 | Morinaga et al. | 257/778 |
| 2002/0075664 A1* | 6/2002 | Perkins et al. | 361/816 |
| 2003/0031339 A1* | 2/2003 | Marshall et al. | 381/400 |
| 2003/0089983 A1* | 5/2003 | Huang et al. | 257/738 |
| 2003/0136812 A1* | 7/2003 | Seidler | 228/179.1 |
| 2003/0141105 A1* | 7/2003 | Sugaya et al. | 174/256 |
| 2003/0160316 A1* | 8/2003 | Shieh et al. | 257/686 |
| 2004/0056277 A1 | 3/2004 | Karnezos | |
| 2004/0061212 A1 | 4/2004 | Karnezos | |
| 2004/0061213 A1 | 4/2004 | Karnezos | |
| 2004/0063242 A1 | 4/2004 | Karnezos | |
| 2004/0063246 A1 | 4/2004 | Karnezos | |
| 2004/0065963 A1 | 4/2004 | Karnezos | |
| 2004/0113253 A1 | 6/2004 | Karnezos | |
| 2004/0113254 A1 | 6/2004 | Karnezos | |
| 2004/0113255 A1 | 6/2004 | Karnezos | |
| 2004/0113257 A1 | 6/2004 | Boireau | |
| 2004/0113275 A1 | 6/2004 | Karnezos | |
| 2004/0119152 A1 | 6/2004 | Karnezos | |
| 2004/0119153 A1 | 6/2004 | Karnezos | |
| 2004/0124518 A1 | 7/2004 | Karnezos | |
| 2004/0175916 A1 | 9/2004 | Shin | |
| 2004/0195667 A1 | 10/2004 | Karnezos | |
| 2004/0217459 A1 | 11/2004 | Fee | |
| 2004/0218372 A1* | 11/2004 | Hamasaki et al. | 361/767 |
| 2004/0226744 A1* | 11/2004 | Asahi et al. | 174/262 |
| 2004/0231872 A1* | 11/2004 | Arnold et al. | 174/35 R |
| 2004/0232452 A1* | 11/2004 | Tsuneoka et al. | 257/222 |
| 2005/0001331 A1* | 1/2005 | Kojima et al. | 257/778 |
| 2005/0045369 A1* | 3/2005 | Ishimaru et al. | 174/250 |
| 2005/0077613 A1 | 4/2005 | McLellan et al. | |
| 2005/0148113 A1* | 7/2005 | Karnezos | 438/109 |
| 2005/0161793 A1* | 7/2005 | Ohno et al. | 257/686 |
| 2005/0205979 A1* | 9/2005 | Shin et al. | 257/678 |
| 2005/0207133 A1* | 9/2005 | Pavier et al. | 361/761 |
| 2005/0230799 A1* | 10/2005 | Kang | 257/684 |
| 2005/0230848 A1* | 10/2005 | Nakatani et al. | 257/783 |
| 2005/0269681 A1* | 12/2005 | Asahi et al. | 257/686 |
| 2005/0280127 A1* | 12/2005 | Zhao et al. | 257/678 |
| 2005/0280139 A1* | 12/2005 | Zhao et al. | 257/704 |
| 2006/0113642 A1* | 6/2006 | Kajiki et al. | 257/659 |
| 2006/0158295 A1* | 7/2006 | Karnezos et al. | 336/115 |
| 2006/0220210 A1* | 10/2006 | Karnezos et al. | 257/686 |
| 2006/0249828 A1* | 11/2006 | Hong | 257/686 |
| 2007/0031996 A1* | 2/2007 | Chopin et al. | 438/122 |
| 2007/0145539 A1* | 6/2007 | Lam | 257/659 |
| 2007/0216010 A1* | 9/2007 | Yim et al. | 257/690 |
| 2007/0218689 A1* | 9/2007 | Ha et al. | 438/686 |
| 2007/0235855 A1* | 10/2007 | Bokatius et al. | 257/691 |
| 2007/0262465 A1* | 11/2007 | Iwabuchi | 257/777 |
| 2008/0122068 A1* | 5/2008 | Kelly et al. | 257/712 |
| 2008/0136006 A1* | 6/2008 | Jang et al. | 257/686 |
| 2008/0150093 A1* | 6/2008 | Jang et al. | 257/659 |
| 2008/0197468 A1* | 8/2008 | Kim et al. | 257/686 |

FOREIGN PATENT DOCUMENTS

| | | |
|---|---|---|
| JP | 60182731 | 9/1985 |
| JP | 61059862 | 3/1986 |
| JP | 61117858 | 6/1986 |
| JP | 62119952 | 6/1987 |
| JP | 62126661 | 6/1987 |
| JP | 62142341 | 6/1987 |
| JP | 63128736 | 6/1988 |
| JP | 63211663 | 9/1988 |
| JP | 63244664 | 10/1988 |
| JP | 1028856 | 1/1989 |
| JP | 1071162 | 3/1989 |
| JP | 1099248 | 4/1989 |
| JP | 3169062 | 7/1991 |
| JP | 4028260 | 1/1992 |
| JP | 4056262 | 2/1992 |
| JP | 4116859 | 4/1992 |
| JP | 4368154 | 12/1992 |
| JP | 4368167 | 12/1992 |
| JP | 5013665 | 1/1993 |
| JP | 5075015 | 3/1993 |
| JP | 5109975 | 4/1993 |
| JP | 5136323 | 6/1993 |
| JP | 5283601 | 10/1993 |
| JP | 5343607 | 12/1993 |
| JP | 6120364 | 4/1994 |
| JP | 6151645 | 5/1994 |
| JP | 6163751 | 6/1994 |
| JP | 10256470 | 9/1998 |
| JP | 11354682 | 12/1999 |

* cited by examiner

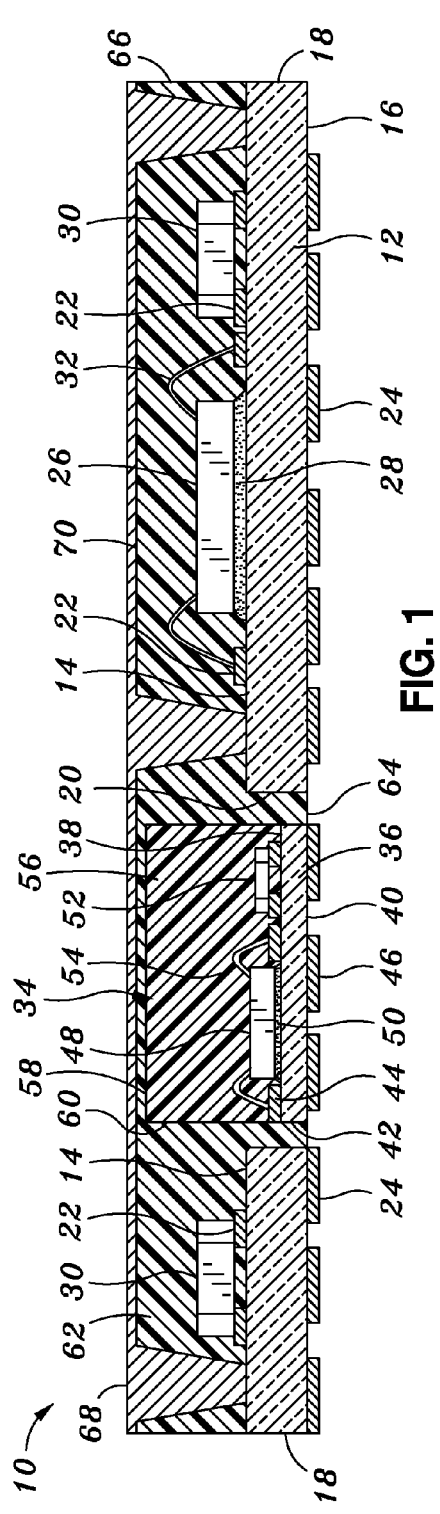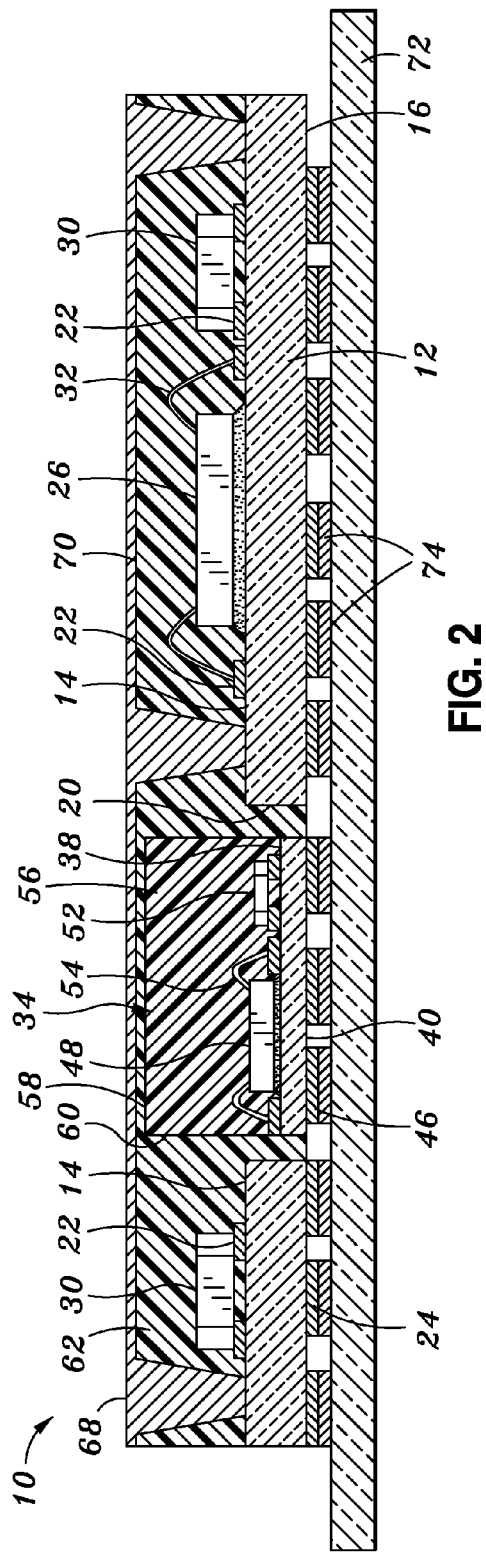
FIG. 1
FIG. 2

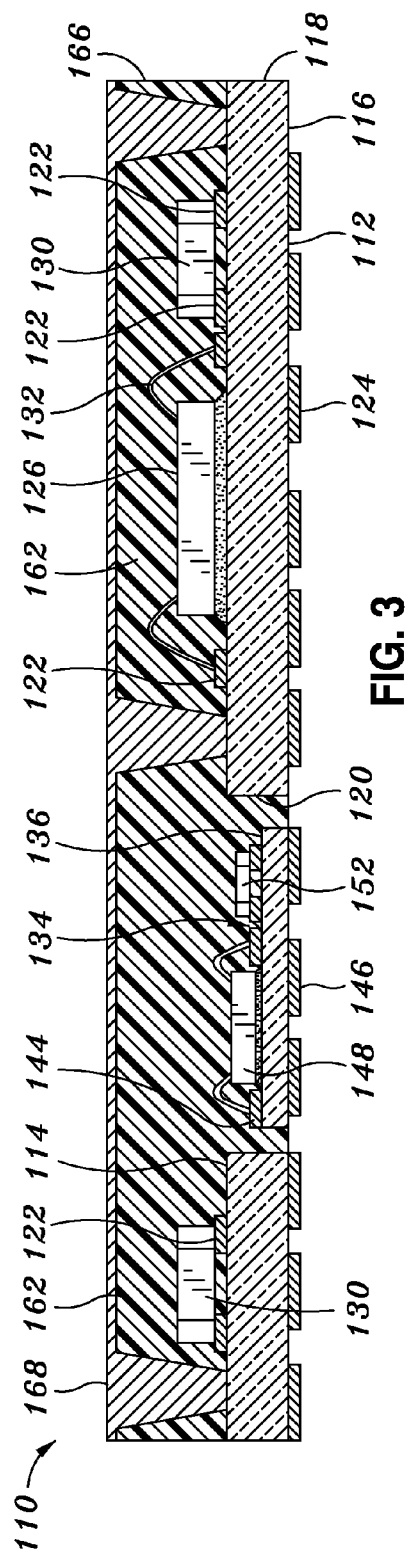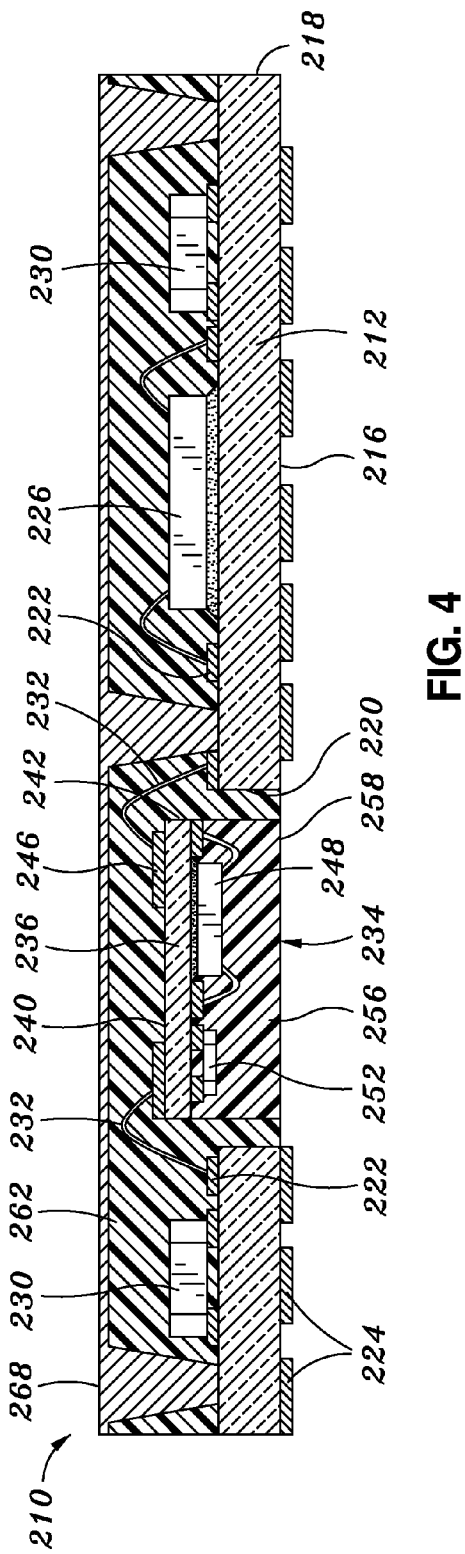

SEMICONDUCTOR PACKAGE IN PACKAGE

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package having a second semiconductor package integrated therein.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. In the field of electronics, there is a continuing evolution of products which are smaller and more complex. As a result, the semiconductor packages incorporated into these products must be smaller and more complex as well.

The elements of currently known semiconductor packages include a metal leadframe, an integrated circuit or semiconductor die, bonding material to attach the semiconductor die to the leadframe, bond wires which electrically connect terminals on the semiconductor die to individual leads of the leadframe, and a hard plastic encapsulant material which covers the other components and forms the exterior of the semiconductor package commonly referred to as the package body. The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially enclosed therein for use in electrically connecting the package to another component. In certain semiconductor packages, the leadframe is substituted with a substrate such as a laminate substrate to which the semiconductor die(s) are mounted. Formed on that surface of the substrate to which the semiconductor die(s) are mounted is a conductive pattern to which the semiconductor die(s) is/are electrically connected through the use of, for example, conductive wires. Formed on the opposite surface of the substrate are conductive pads or contacts which are electrically connected to the conductive pattern in a prescribed arrangement through the use of conductive vias extending through the substrate. The package body is often formed to cover those surfaces of the substrate other than that surface including the contacts formed thereon.

With regard to those semiconductor packages including substrates as opposed to leadframes, one technique used in the prior art for minimizing the thickness of such semiconductor packages is the placement of one or more electronic components (e.g., semiconductor dies, passive devices, etc.) of such package into corresponding cavities or through-hole openings formed in the substrate. However, when a cavity or through-hole opening is made in the substrate, the available surface area of the substrate is effectively reduced, therefore reducing the usable area on which printed wiring interconnection patterns such as the above-described conductive pattern may be formed. In this regard, the increasing need for complex functionality in semiconductor packages as discussed above generates a corresponding need for increased surface area on the semiconductor package substrate upon which interconnection patterns may be formed to accommodate the electronic components of the package.

Another deficiency with currently known semiconductor packages which include either a leadframe or a substrate arises when one or more of the electronic components interfaced to the leadframe or substrate is stress-sensitive (e.g., a crystal). In this regard, during the process of pressure injection molding the package body of the semiconductor package, a crystal which is mounted to the leadframe or substrate may become stressed. Though attempts have been made to place any stress-sensitive component near a surface of the leadframe or substrate that is not in contact with the package body, such placement typically results in the stress-sensitive component being disclosed in close proximity to a surface of the leadframe or substrate used to effectuate the electrical connection between the leadframe or substrate and the electronic component(s) of the package. The resultant electrical interconnection activity near the stress-sensitive component often produces undesirable effects therein. Yet another deficiency arises when certain types of semiconductor dies or other electronic components are directly attached to the leadframe or substrate of the semiconductor package. More particularly, when such devices are subjected to encapsulation stresses during the pressure injection formation of the package body of the semiconductor package, such stresses may result in an operational failure of the devices. As will be recognized, such an operational failure typically mandates that the entire semiconductor package be discarded. Thus, there exists a need in the art for a semiconductor package which avoids the aforementioned deficiencies and shortcomings of currently known semiconductor packages, yet satisfies the demands for semiconductor packages which are of reduced thickness and increased complexity/functionality. These, as well as other features and attributes of the present invention will be discussed in more detail below.

BRIEF SUMMARY OF THE INVENTION

In accordance with the present invention, there is provided a semiconductor package having a second semiconductor package or module integrated therein. The semiconductor package of the present invention typically comprises active and passive devices which are each electrically connected to an underlying substrate. The substrate is configured to place such active and passive devices into electrical communication with contacts of the substrate disposed on a surface thereof opposite that to which the active and passive devices are mounted. The module of the semiconductor package resides within a complimentary opening disposed within the substrate thereof. The module and the active and passive devices of the semiconductor package are each fully or at least partially covered by a package body of the semiconductor package. In one embodiment of the semiconductor package, a surface of the module including exposed module contacts disposed thereon is not covered by the package body. In this particular embodiment of the present invention, active and passive devices of the module are placed into electrical communication with the active and passive devices of the remainder of the semiconductor package by the wiring pattern of an underlying printed circuit board to which the semiconductor package is mounted. In another embodiment of the present invention, conductive wires covered by the package body are used to electrically connect the module to the substrate of the semiconductor package, and hence to the active and passive devices mounted and electrically connected to the substrate.

These and other features, aspects and advantages of the present invention will become better understood with reference to the following drawings, description and claims.

BRIEF DESCRIPTION OF THE DRAWINGS

These, as well as other features of the present invention, will become more apparent upon reference to the drawings wherein:

FIG. 1 is a cross-sectional view of a semiconductor package constructed in accordance with a first embodiment of the present invention;

FIG. 2 is a cross-sectional view of the semiconductor package of the first embodiment identical to that shown in FIG. 1, but further illustrating the semiconductor package as operatively connected to an underlying substrate such as a printed circuit board;

FIG. 3 is a cross-sectional view of a semiconductor package constructed in accordance with a second embodiment of the present invention;

FIG. 4 is a cross-sectional view of a semiconductor package constructed in accordance with a third embodiment of the present invention;

Common reference numerals are used throughout the drawings and detailed description to indicate like elements.

DETAILED DESCRIPTION OF THE INVENTION

Figure 1A:
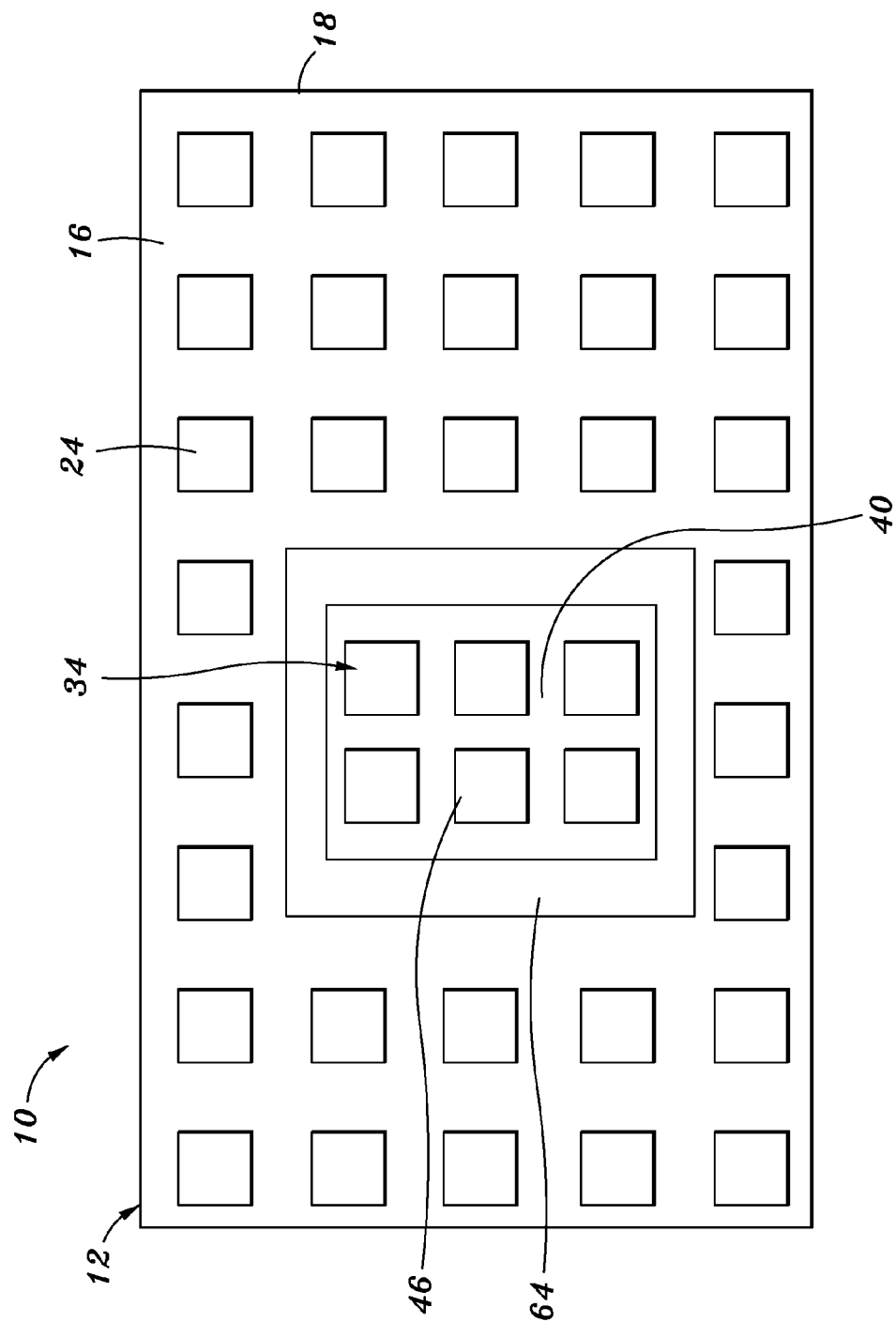
FIG. 1A is a bottom plan view of the semiconductor package shown in FIG. 1.

Referring now to the drawings wherein the showings are for purposes of illustrating preferred embodiments of the present invention only, and not for purposes of limiting the same, FIGS. 1 and 2 depict a semiconductor package 10 constructed in accordance with a first embodiment of the present invention. The semiconductor package 10 comprises a substrate 12 which has a generally quadrangular (e.g. rectangular) configuration. The substrate 12 defines a generally planar top surface 14 and an opposed, generally planar bottom surface 16. In addition to the top and bottom surfaces 14, 16, the substrate 12 defines four generally planar peripheral edge segments or side surfaces 18. Disposed within the substrate 12 is a generally quadrangular opening 20 which extends between the top and bottom surfaces 14, 16 and is used for reasons which will be discussed in more detail below. The substrate 12 is preferably fabricated from an insulative or dielectric material, and may comprise a laminate structure.

Disposed on the top surface 14 of the substrate 12 is a conductive pattern 22 which may comprise conductive pads, conductive traces, or combinations thereof. Disposed on the bottom surface 16 of the substrate 12 is a plurality of conductive contacts 24. As best seen in FIG. 1A, each of the contacts 22 has a generally square configuration, though alternative shapes for the contacts 24 are contemplated to be within the spirit and scope of the present invention. Additionally, the contacts 24 are arranged on the bottom surface 16 in multiple rows and columns wherein the contacts 24 are disposed in spaced relation to each other and to the side surfaces 18 of the substrate 12. In the substrate 12 of the semiconductor package 10, the conductive contacts 24 are electrically connected to the conductive pattern 22 by conductive vias (not shown) which extend through the substrate 12. Those of ordinary skill in the art will recognize that the present invention is not limited to any specific pattern of electrical interconnection between the conductive pattern 22 disposed on the top surface 14 of the substrate 12 and the conductive contacts 24 disposed on the bottom surface 16 of the substrate 12. The conductive pattern 22, contacts 24 and vias extending therebetween are each preferably fabricated from a suitable conductive, metal material. Further, it is contemplated that the conductive pattern 22 and contacts 24 may each be fabricated from the completion of a suitable etching process subsequent to the formation of metal layers upon each of the top and bottom surfaces 14, 16 of the substrate 12.

In addition to the substrate 12, the semiconductor package 10 comprises at least one active device 26 (e.g., a semiconductor die) which is attached to the top surface 14 of the substrate 12. More particularly, the attachment of the active device 26 to the top surface 14 is preferably facilitated by a layer 28 of a suitable adhesive such as an epoxy. In addition to the active device 26, also attached to the top surface 14 of the substrate 12 is a plurality of passive devices 30. In the semiconductor package 10, the active device 26 is electrically connected to the conductive pattern 22 through the use of conductive wires 32. However, it is contemplated that the active device 26 may alternately be attached to the conductive pattern 22 through the use of a flip chip interconnection. The passive devices 30 are each preferably electrically connected to the conductive pattern 22 through the use of surface mounting technology (SMT) in the manner shown in FIG. 1. As will be recognized, the conductive pattern 22 and corresponding conductive vias may be configured to facilitate the placement of the active and passive devices 26, 30 into electrical communication with the contacts 24 in any desired pattern or arrangement. Additionally, those of ordinary skill in the art will recognize that the semiconductor package 10 may include more than the single active device 26 shown in FIG. 1, and/or greater or fewer than the two passive devices 30 also shown in FIG. 1.

The semiconductor package 10 further comprises a semiconductor package module 34, which may be a second semiconductor package. The module 34 comprises a module substrate 36 which has a generally quadrangular (e.g. rectangular) configuration. The module substrate 36 defines a generally planar top surface 38 and an opposed, generally planar bottom surface 40. In addition to the top and bottom surfaces 38, 40, the module substrate 36 defines four generally planar peripheral edge segments or side surfaces 42. The module substrate 36 is preferably fabricated from an insulative or dielectric material, and may comprise a laminate structure.

Disposed on the top surface 38 of the module substrate 36 is a conductive pattern 44 which may comprise conductive pads, conductive traces, or combinations thereof. Disposed on the bottom surface 40 of the module substrate 36 is a plurality of conductive contacts 46. As best seen in FIG. 1A, each of the contacts 46 has a generally square configuration, though alternative shapes for the contacts 46 are contemplated to be within the spirit and scope of the present invention. Additionally, the contacts 46 are arranged on the bottom surface 40 in multiple rows and columns wherein the contacts 46 are disposed in spaced relation to each other and to the side surfaces 42 of the module substrate 36. In the module substrate 36 of the module 34, the conductive contacts 46 are electrically connected to the conductive pattern 44 by conductive vias (not shown) which extend through the module substrate 36. Those of ordinary skill in the art will recognize that the present invention is not limited to any specific pattern of electrical interconnection between the conductive pattern 44 disposed on the top surface 38 of the module substrate 36 and the conductive contacts 46 disposed on the bottom surface 40 of the module substrate 36. The conductive pattern 44, contacts 46 and vias extending therebetween are each preferably fabricated from a suitable conductive, metal material. Further, it is contemplated that the conductive pattern 44 and contacts 46 may each be fabricated from the completion of a suitable etching process subsequent to the formation of metal layers upon each of the top and bottom surfaces 38, 40 of the module substrate 36.

In addition to the module substrate 36, the module 34 comprises at least one active device 48 (e.g., a semiconductor die) which is attached to the top surface 38 of the module substrate 36. More particularly, the attachment of the active device 48 to the top surface 38 is preferably facilitated by a layer 50 of a suitable adhesive such as an epoxy. In addition to the active device 48, also attached to the top surface 38 of the module substrate 36 is at least one passive device 52. In the module 34, the inclusion of the passive device 52 is optional, i.e., the module 34 may include only the active device 48. The active device 48 is electrically connected to the conductive pattern 44 through the use of conductive wires 54. However, it is contemplated that the active device 26 may alternately be attached to the conductive pattern 22 through the use of a flip chip interconnection. The passive device 52, if included, is preferably electrically connected to the conductive pattern 44 through the use of surface mounting technology (SMT) in the manner shown in FIG. 1. As will be recognized, the conductive pattern 44 and corresponding conductive vias may be configured to facilitate the placement of the active and passive devices 48, 52 into electrical communication with the contacts 46 in any desired pattern or arrangement. Additionally, those of ordinary skill in the art will recognize that the module 34 may include more than the single active device 48 and/or the single passive device 52 shown in FIG. 1.

The module 34 of the semiconductor package 10 further includes a module body 56 which covers the active and passive devices 48, 52, the wires 54, and the entirety of the top surface 38 of the module substrate 36 including the conductive pattern 44 disposed thereon. The fully formed module body 56 has a generally quadrangular configuration, and defines a generally planar top surface 58. In addition to the top surface 58, the module body 56 defines multiple generally planar side surfaces 60 which each extend perpendicularly relative to the top surface 58 and in substantially flush, co-planar relation to respective ones of the side surfaces 42 of the module substrate 36. The module body 56 is preferably fabricated from a suitable insulative material, such as an epoxy resin, through the completion of an injection molding process.

In the semiconductor package 10, the module 34 having the above-described structural attributes is positioned within the opening 20 of the substrate 12 in the orientation shown in FIGS. 1 and 1A. More particularly, the module 34 is positioned within the opening 20 such that a gap or space is defined between those surfaces of the substrate 12 defining the opening 20 and the side surfaces 42, 60 of the module substrate 36 and module body 56 of the module 34.

The semiconductor package 10 further comprises a package body 62 which covers the active and passive devices 26, 30, the conductive wires 32, and the majority of the top surface 14 of the substrate 12 including the conductive pattern 22 formed thereon. The package body 62 also covers the entirety of the module 34 except for the bottom surface 40 of the module substrate 36 having the contacts 46 disposed thereon. As seen in FIG. 1, the package body 62 extends into the gap or space defined between the module 34 and the substrate 12, the package body 62 thus defining a bottom surface 64 which extends in substantially flush, co-planar relation to both the bottom surface 16 of the substrate 12 and the bottom surface 40 of the module substrate 36. In this regard, the orientation of the module 34 relative to the substrate 12 is preferably such that the bottom surfaces 16, 40 extend in generally co-planar relation to each other. In addition to the bottom surface 64, the package body defines multiple, generally planar side surfaces 66 which preferably extend in substantially flush, co-planar relation to respective ones of the side surfaces 18 of the substrate 12. Like the module body 56, the package body 62 is preferably fabricated from a suitable insulative material such as an epoxy resin through the completion of an injection molding process.

As indicated above, the package body 62 preferably does not cover the entirety of the top surface 14 of the substrate 12. More particularly, it is contemplated that voids may be formed within the package body 62 to accommodate portions of an RF (radio frequency) shield 68 which may optionally be included in the semiconductor package 10, as shown in FIGS. 1 and 2. The RF shield 68 is preferably fabricated from a suitable conductive material, and is electrically connected to the conductive pattern 22 disposed on the top surface 14 of the substrate 12. In addition to including portions which are received into respective ones of the corresponding voids disposed in the package body 62, the RF shield 68 also includes a generally planar, plate-like portion which covers or shields the majority of the generally planar top surface 70 of the package body 62. As will be recognized, the package body 62 will typically cover the entirety of the top surface 14 of the substrate 12 including the conductive pattern 22 disposed thereon if the RF shield 68 is not included in the semiconductor package 10. Those of ordinary skill in the art will recognize that if the RF shield 68 is not included in the semiconductor package 10, the uppermost surface of such semiconductor package 10 will be defined by the generally planar top surface 70 of the package body 62.

FIG. 2 provides a cross-sectional view of the semiconductor package 10 identical to that shown in FIG. 1, but further illustrating the semiconductor package 10 as electrically connected to an underlying support structure such as a printed circuit board 72. Though not shown, the printed circuit board includes a printed wiring pattern disposed on the top surface thereof. The contacts 24, 46 of the semiconductor package 10 are placed into electrical communication with the wiring pattern of the printed circuit board 72 through the use of, for example, reflowed solder layers 74. It is contemplated that the printed circuit board 72 itself, and more particularly the wiring pattern disposed thereon, will be used to facilitate the electrical connection or communication between the active and passive devices 48, 52 of the module 34 of the semiconductor package 10, and those active and passive devices 26, 30 of the semiconductor package 10 which are not integrated into the module 34. That is, the module 34 electrically communicates with the active and passive devices 26, 30 by communicating signals through the printed circuit board 72. Furthermore, power and ground signals may be transmitted to and from the module 34 and/or the active device 26 and the passive devices 30 by the printed circuit board 72.

Referring now to FIG. 3, there is shown a semiconductor package 110 constructed in accordance with a second embodiment of the present invention. In FIG. 3, the 100 series reference numbers correspond to respective ones of the 10 series reference numbers included in FIGS. 1, 1A and 2. The semiconductor package 110 is substantially similar in structure and function to the above-described semiconductor package 10, with only the distinctions between the semiconductor packages 10, 110 being highlighted below.

The sole distinction between the semiconductor packages 10, 110 lies in the configuration of the module 134 in the semiconductor package 110. More particularly, the module 134 differs from the module 34 in that the module 134 does not include the module body 56 described above in relation to the module 34. As a result, in the semiconductor package 110, the active and passive devices 148, 152 of the module 134 are covered or encapsulated by the package body 162 of the semiconductor package 110 in the manner shown in FIG. 3.

Referring now to FIG. 4, there is shown a semiconductor package 210 constructed in accordance with a third embodiment of the present invention. In FIG. 4, the 200 series reference numbers correspond to respective ones of the 10 series reference numbers included in FIGS. 1, 1A and 2, with only the distinctions between the semiconductor packages 10, 210 being highlighted below.

The primary distinction between the semiconductor packages 10, 210 is that the module 234 in the semiconductor package 210 is inverted or turned upside down relative to the orientation of the module 34 included in the semiconductor package 10. As a result, in the completed semiconductor package 210, the generally planar top surface 258 of the module body 256 extends in substantially flush, co-planar relation to the generally planar bottom surface 216 of the substrate 212. Thus, the entirety of those portions of the module substrate 236 not covered by the module body 256 are actually covered by the package body 262 of the semiconductor package 210. The package body 262 thus covers the side surfaces 242 of the module substrate 236, as well as the bottom surface 240 thereof having the contacts 246 disposed thereon.

Due to the orientation of the module 234 therein, in the semiconductor package 210, an underlying structure such as the above-described printed circuit board 72 is not used to facilitate the electrical connection or communication between the active and passive devices 226, 230 of the semiconductor package 210 and the active and passive devices 248, 252 of the module 234. Rather, the active and passive devices 248, 252 of the module 234 are placed into electrical connection or communication with the conductive pattern 222 of the substrate 212 through the use of the same conductive wires 232 used to facilitate the electrical connection of the active device 226 to the conductive pattern 222. As will be recognized by those of ordinary skill in the art, the use of the conductive wires 232 to facilitate the electrical connection of the module 234 to the substrate 212 is made necessary by the complete covering or encapsulation of the contacts 246 of the module 234 by the package body 262 of the semiconductor package 210 as described above. A further distinction between the semiconductor packages 10, 210 lies in the configuration of the contacts 224 included in the semiconductor package 210 in comparison to the contacts 24 included in the semiconductor package 10. More particularly, the contacts 224 of the semiconductor package 210 as shown in FIG. 4 have a substantially thinner profile in comparison to the contacts 24. However, those of ordinary skill in the art will recognize that the contacts 224 may be identically configures to the contacts 24 without departing from the spirit and scope of the present invention.

Figure 5:
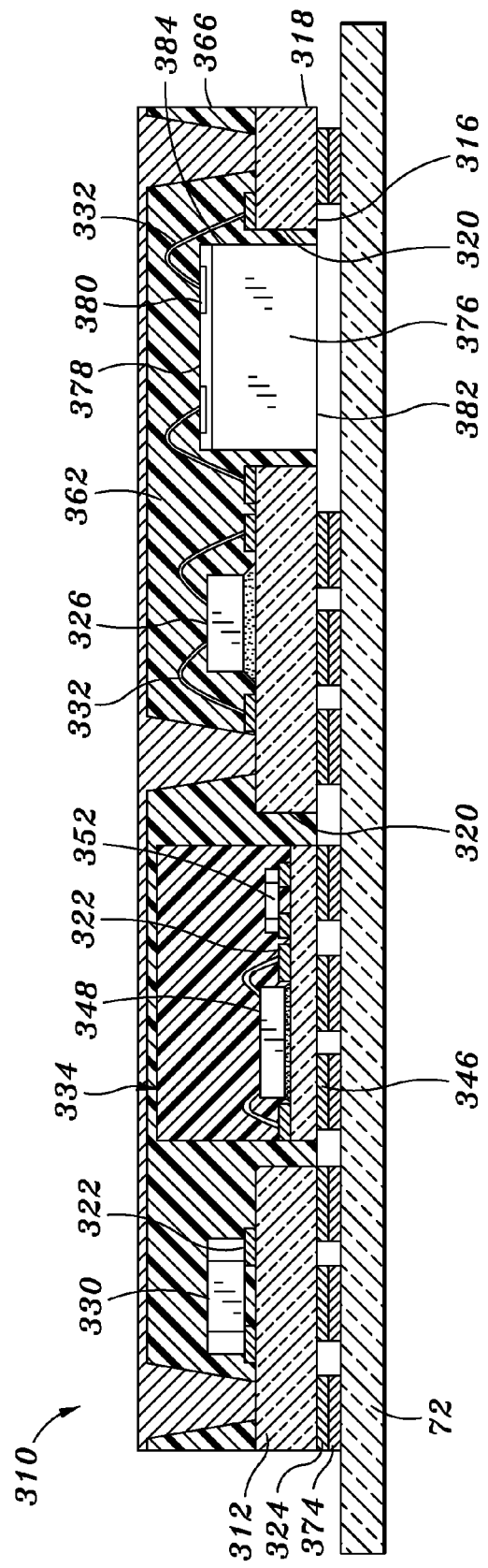
FIG. 5 is a cross-sectional view of a semiconductor package constructed in accordance with a fourth embodiment of the present invention, further illustrating the semiconductor package as operatively connected to an underlying substrate such as a printed circuit board.

Referring now to FIG. 5, there is shown a semiconductor package 310 constructed in accordance with a fourth embodiment of the present invention. In FIG. 5, the 300 series reference numbers correspond to respective ones of the 10 series reference numbers included in FIGS. 1, 1A and 2. In this regard, only the distinctions between the semiconductor packages 10, 310 will be highlighted below.

In the semiconductor package 310, two openings 320 are formed in the substrate 312. One of these openings 320 is used to accommodate the module 334 of the semiconductor package 310 in the same manner and orientation as described above in relation to the module 34 and opening 20 of the substrate 12 in the semiconductor package 10. The remaining opening 320 in the substrate 312 has an electronic component 376 (e.g., a crystal) disposed therein. The electronic component 376 defines a generally planar top surface 378 having a plurality of conductive terminals 380 disposed thereon. In addition to the top surface 378, the electronic component 376 defines a generally planar bottom surface 382, and a plurality of generally planar side surfaces 384 which extend generally perpendicularly between the top and bottom surfaces 378, 382. The electronic component 376 is positioned within the corresponding opening 320 such that the bottom surface 382 thereof extends in substantially flush, co-planar relation to the bottom surface 316 of the substrate 312. Additionally, the orientation of the electronic component 376 within the corresponding opening 320 is such that a gap is defined between the side surfaces 384 and those surfaces of the substrate 312 which define the opening 320.

In the semiconductor package 310, the terminals 380 of the electronic component 376 are electrically connected to the conductive pattern 322 of the substrate 312 through the use of the same conductive wires 332 used to facilitate the electrical connection of the active device 326 of the semiconductor package 310 to the conductive pattern 322. The top and side surfaces 378, 384 of the electronic component 376, as well as the wires 332 used to electrically connect the same to the conductive pattern 322, are each covered by the package body 362 of the semiconductor package 310. In FIG. 5, the semiconductor package 310 is depicted as being electrically connected to the underlying printed circuit board 72 through the use of reflowed solder layers 374 which are disposed between a wiring pattern of the printed circuit board 72 and respective ones of the contacts 324 of the substrate 312 and the contacts 346 of the module 334 of the semiconductor package 310. In the semiconductor package 310 shown in FIG. 5, the contacts 324 of the substrate 312 as well as the contacts 346 of the module 334 have the same thinner profile as described above in relation to the contacts 224 of the semiconductor package 210 shown in FIG. 4.

Figure 6A:
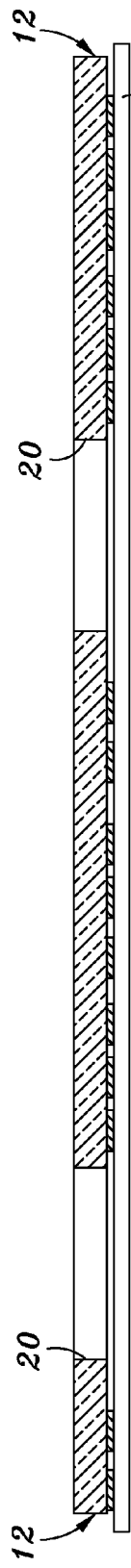
FIGS. 6A-6E illustrate an exemplary sequence of steps which may be used to facilitate the fabrication of a semiconductor package in accordance with either the first embodiment of the present invention.

Referring now to FIGS. 6A-6E, there is shown an exemplary sequence of steps which may be used to facilitate the fabrication of a semiconductor package 10 as shown and described above in relation to FIGS. 1, 1A and 2. In the initial step of the fabrication methodology, a strip 500 is provided, the strip 500 comprising two or more substrates 12 integrally connected to each other. The strip 500 includes a plurality of openings 20 formed therein in a prescribed pattern or arrangement. As will be recognized by those of ordinary skill in the art, the openings 20 are arranged in the strip 500 such that one opening 20 is included in each of the substrates 12 which will ultimately be defined by the cutting or singulation of the strip 500. In FIG. 6A, the strip 500 is depicted as defining two integrally connected substrates 12, though those of ordinary skill in the art will recognize that the strip 500 may be formed so as to include more than two integrally connected substrates 12. Though not shown in FIGS. 6A-6E, the strip 500 is fabricated to include conductive metal features which will ultimately form the conductive pattern 22 and conductive contacts 24 of each of the substrates 12 ultimately singulated from the strip 500.

Figure 6B:
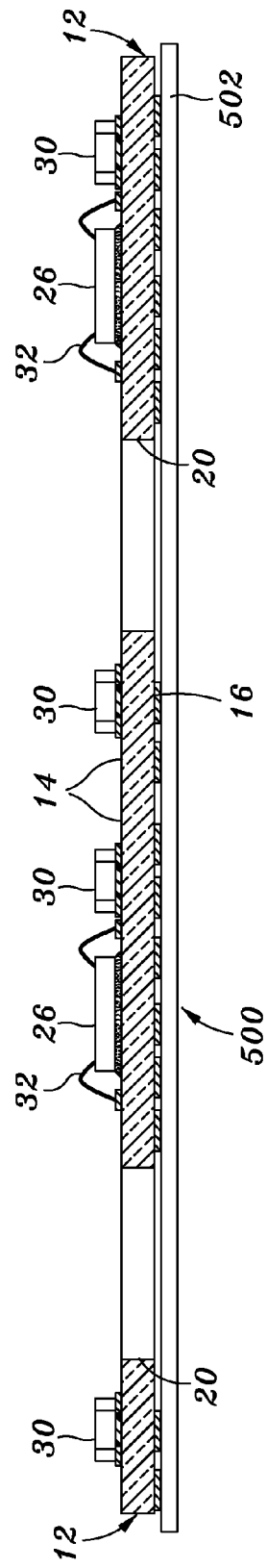

In one of the initial stages of the fabrication process for the semiconductor packages 10, the strip 500 is subjected to a screen printing process wherein solder paste is patterned onto those metal features of the strip 500 which will ultimately define the conductive patterns 22 on the substrates 12 singulated from the strip 500. Upon the completion of such patterning, that side of the strip 500 opposite that including the metal features which will ultimately define the conductive pattern 22 is affixed to a layer of adhesive tape 502 (FIG. 6A). Thereafter, the passive devices 30 are placed in prescribed locations upon the solder paste pattern, with a subsequently completed reflow process effectuating the electrical connection of such passive devices 30 to the solder paste pattern, and hence to respective ones of the conductive patterns 22 defined by each of the integrally connected substrates 12 within the strip 500 (FIG. 6B). Also attached to the strip 500 at prescribed positions upon that surface thereof to which the passive devices 30 are mounted are the active devices 26. As shown in FIG. 6B, the active devices 26 are each electrically connected to the metal features which will ultimately define the conductive pattern 22 of each substrate 12 singulated from the strip 500 by the above-described conductive wires 32.

Figure 6C:
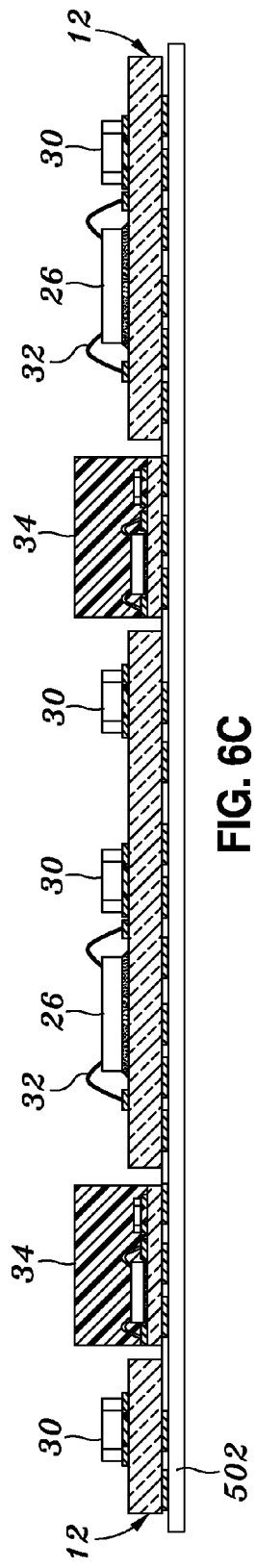

Subsequent to the attachment and electrical connection of the active and passive devices 24, 30 to the strip 500, one of the above-described modules 34 is placed into each of the openings 20 of the strip 500 (FIG. 6C). As will be recognized and as is shown in FIG. 6C, the bottom surface 40 of the module substrate 36 of each module 34 including the contacts 46 disposed thereon is directly engaged to and thus covered by the adhesive tape layer 502.

Figure 6D:
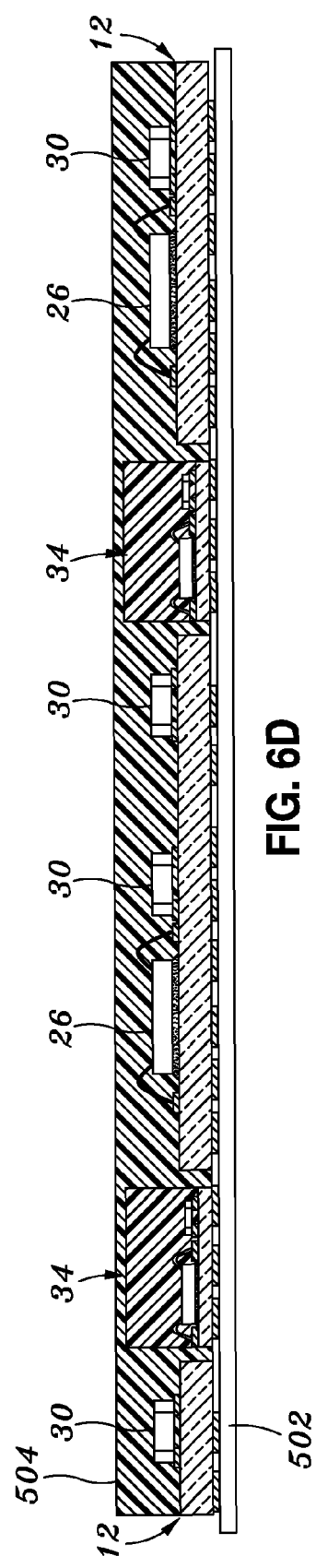

In the next step of the fabrication process, the subassembly of the sheet 500, active and passive devices 26, 30, conductive wires (not shown) and modules 34 is subjected to a plasma cleaning process, with these particular components thereafter each being covered or encapsulated by a continuous mold cap 504 (FIG. 6D). As shown in FIG. 6D, the mold cap 504 flows into each of the openings 20 of the strip 500 and into contact with the adhesive tape layer 502. The mold cap 504 covers those surfaces of the modules 34 not covered by the adhesive tape layer 502, and further covers the active and passive devices 26, 30, the conductive wires 32 used to facilitate the electrical connection of the active devices 26 to those metal features of the strip 500 which will ultimately define the conductive patterns 22 of the substrates 12 singulated from the strip 500, and the exposed portion of that surface of the strip 500 having the active and passive devices 26, 30 mounted and electrically connected thereto.

Figure 6E:
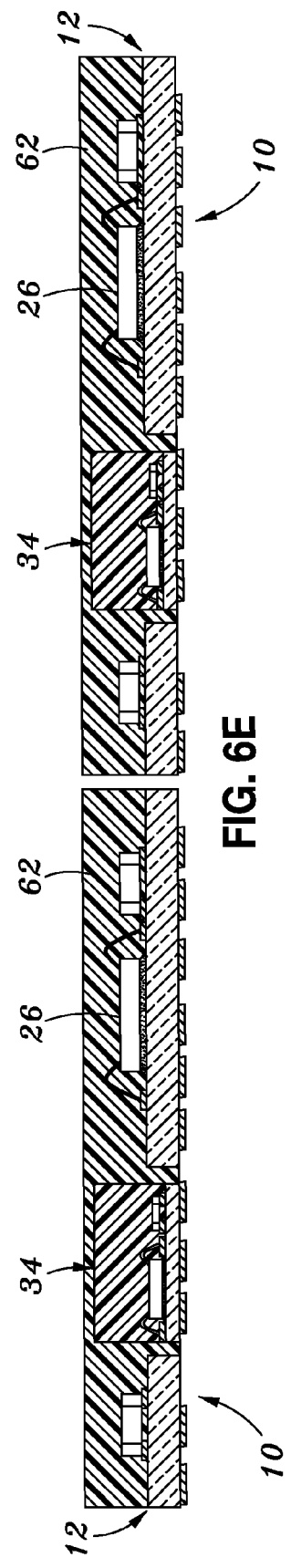

Subsequent to the fabrication of the mold cap 504, the adhesive tape layer 502 is removed from the strip 500, with a singulation process thereafter being completed to cut the strip 500 and mold cap 504 in a manner defining the separate semiconductor packages 10 (FIG. 6E). It is contemplated that such singulation may be achieved by conventional sawing or laser cutting. A water jet may also be used to facilitate such singulation. As will be recognized, the cutting of the strip 500 facilitates the formation of the separate substrates 12 of each resultant semiconductor package 10, with the cutting of the mold cap 504 facilitating the formation of the separate package body 62 of each resultant semiconductor package 10. In the fabrication of the semiconductor packages 10 in the above-described manner, it will be appreciated by those of ordinary skill in the art that each module 34 may be tested after its fabrication, but prior to its incorporation into the semiconductor package 10. When each module 34 is itself fabricated and the module body 56 thereof formed, the active and passive devices 48, 52 of such module 34 are subjected to assembly and encapsulation stresses. The testing of the module 34 subsequent to the formation of the module body 56 but prior to its integration into the semiconductor package 10 allows for the elimination of defective modules 34 prior to their incorporation into any semiconductor package 10. Those of ordinary skill in the art will further recognize that the above-described fabrication process for the semiconductor package 10 may also be applied to the semiconductor packages 110, 210, 310 without departing from the spirit and scope of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a substrate having at least one opening extending from a substrate top surface to a substrate bottom surface, wherein the substrate has a substrate conductive pattern disposed on the substrate top surface and a plurality of contacts disposed on the substrate bottom surface, the contacts being in electrical communication with the substrate conductive pattern;
   at least two electronic components attached to the substrate top surface and electrically connected to the substrate conductive pattern;
   an electronic module at least partially disposed within the opening and including a plurality of module contacts and a module body with a module top surface opposite to the module contacts, the electronic module further comprising:
      a module substrate having a module conductive pattern disposed on a module substrate top surface, the plurality of module contacts disposed on a module substrate bottom surface, the module contacts being in electrical communication with the module conductive pattern; and
      an electronic module component attached to the module substrate top surface and electrically connected to the module conductive pattern, wherein the module body covers the electronic module component, and wherein the module body entirely covers the module conductive pattern; and a package body at least partially encapsulating the substrate, the electronic components and the electronic module such that the contacts of the substrate and the module contacts of the electronic module are exposed in a common exterior surface of the semiconductor package, the package body further overlapping and encapsulating the top surface of the module body, wherein the package body and the module body completely electrically isolate the module conductive pattern from the substrate conductive pattern.

2. The semiconductor package of claim 1 further in combination with a printed circuit board having a wiring pattern disposed thereon, the wiring pattern being configured to place the module contacts of the module into electrical communication with at least some of the contacts of the substrate when the contacts and the module contacts are each electrically connected to the wiring pattern.

3. The semiconductor package of claim 1 wherein the substrate includes:
  a generally planar top surface having the conductive pattern disposed thereon;
  a generally planar bottom surface having the contacts disposed thereon; and
  a plurality of generally planar side surfaces extending between the top and bottom surfaces;
  the side and bottom surfaces of the substrate being uncovered by the package body and thus exposed in the semiconductor package.

4. The semiconductor package of claim 1 wherein the electronic components comprise at least one active device and at least one passive device.

5. The semiconductor package of claim 4 wherein the active device is electrically connected to the substrate conductive pattern by conductive wires which are covered by the package body.

6. The semiconductor package of claim 1 wherein the electronic module component comprises at least one active device.

7. The semiconductor package of claim 6 wherein the active device is electrically connected to the module conductive pattern by conductive wires.

8. The semiconductor package of claim 1 wherein the module substrate includes:
  a generally planar top surface having the module conductive pattern disposed thereon;
  a generally planar bottom surface having the module contacts disposed thereon; and
  a plurality of generally planar side surfaces extending between the top and bottom surfaces.

9. The semiconductor package of claim 8 wherein the module body covers the electronic module components and entirely covers the top surface of the module substrate, and wherein the package body covers the module body and the side surfaces of the module substrate with the bottom surfaces of the module substrate and the substrate being uncovered by the package body and thus exposed in the semiconductor package, and further extending in generally co-planar relation to each other.

10. The semiconductor package of claim 1, wherein the module body defines multiple generally planar side surfaces each extending generally perpendicularly relative to the top surface of the module body in substantially flush, co-planar relation to respective ones of side surfaces of the module substrate.

11. The semiconductor package of claim 8 wherein the module further comprises a module body which covers the electronic module components and the top surface of the module substrate, the side surfaces of the module substrate, the bottom surface of the module substrate including the module conductive pattern thereon, and a portion of the module body each being covered by the package body, with a generally planar body surface defined by the module body and the bottom surface of the substrate being uncovered by the package body and extending in generally co-planar relation to each other.

12. The semiconductor package of claim 11 wherein the module conductive pattern is electrically connected to the substrate conductive pattern by conductive wires which are covered by the package body.

13. The semiconductor package of claim 1, wherein the package body includes a pair of voids on opposing sides of the opening, the semiconductor package further comprising an RF shield overlapping the package body and extending into the pair of voids to electrically connect the RF shield to the conductive pattern of the substrate, the module laterally separated from at least one electronic component by the RF shield.

14. The semiconductor package of claim 1, wherein:
  the substrate includes two openings disposed therein;
  a second electronic module is at least partially disposed within one of the openings; and
  the second electronic module is electrically connected to the conductive pattern of the substrate.

15. The semiconductor package of claim 14 wherein the second electronic module is electrically connected to the conductive pattern of the substrate by conductive wires which are covered by the package body, and a portion of the second electronic module is exposed in the exterior surface of the semiconductor package having the contacts and the module contacts exposed therein.

16. A semiconductor package, comprising:
  a substrate having at least one opening disposed therein, a substrate conductive pattern on a first major surface and a plurality of contacts disposed on a second major surface opposite to the first major surface, the substrate conductive pattern in electrical communication with the plurality of contacts;
  at least two electronic components attached to the substrate and electrically connected to the contacts;
  an internal semiconductor package at least partially disposed within the opening and including a plurality of contacts, the internal semiconductor package including an internal package body having side surfaces and a top surface opposite to the plurality of contacts, the internal semiconductor package further comprising:
    an internal substrate having an internal substrate conductive pattern disposed on a top surface of the internal substrate, the plurality of contacts disposed on a bottom surface of the internal substrate, the plurality of contacts being in electrical communication with the internal substrate conductive pattern; and
    an electronic component attached to the internal substrate and electrically connected to the internal substrate conductive pattern, wherein the internal package body covers the electronic component, and wherein each side surface of the internal package body is substantially co-planar to respective ones of side surfaces of the internal substrate; and
  a package body encapsulating the electronic components, encapsulating the side surfaces of the internal package body, and encapsulating a top surface of the substrate, the package body further overlapping and encapsulating the top surface of the internal package body, wherein the contacts of the substrate and the internal semiconductor package are exposed in a common exterior surface of the semiconductor package, and wherein the package body and the internal package body completely electrically isolate the substrate conductive pattern from the internal substrate conductive pattern.

17. The semiconductor package of claim 16 wherein the package body further comprises a pair of voids on opposite sides of the opening in a cross-sectional view, the semiconductor package further comprising an RF shield overlapping the package body and internal semiconductor package and extending into the pair of voids to electrically connect the RF shield to the substrate, the internal semiconductor package laterally separated from at least one electronic component by the RF shield.

18. The semiconductor package of claim 16 further in combination with a printed circuit board having a wiring pattern disposed thereon, the wiring pattern being configured to place the plurality of contacts of the internal semiconductor package into electrical communication with at least some of the plurality of contacts of the substrate when the plurality of contacts of the substrate and the plurality of contacts of the internal semiconductor package are each electrically connected to the wiring pattern.

19. A semiconductor package, comprising:
   a substrate having a first major surface, a second major surface, and at least one opening extending from the first major surface to the second major surface, the substrate having a substrate conductive pattern on the first major surface and a plurality of contacts disposed on the second major surface;
   at least one electronic component attached to the first major surface and electrically connected to the substrate conductive pattern;
   an electronic module disposed within the opening and including a plurality of module contacts and a module body with a top surface opposite to the module contacts, wherein the module is positioned within the opening such that a gap is defined between the substrate and the module, the electronic module further comprising:
      a module substrate having a module conductive module pattern disposed on a first surface of the module substrate, the plurality of module contacts disposed on a second surface of the module substrate opposite to the first surface, the module contacts being in electrical communication with the module conductive pattern; and
      an electronic module component attached to the module substrate and electrically connected to the module conductive pattern, wherein each side surface of the module body is substantially co-planar to respective ones of side surfaces of the module substrate; and
   a package body at least partially encapsulating the substrate, the electronic components and the module such that the contacts of the substrate and the module contacts of the module extend along a common plane and are exposed in the package body, the package body within the gap and further overlapping and encapsulating the top surface of the module body, wherein the substrate conductive pattern is completely electrically isolated from the module conductive pattern by the package body and the module body.

* * * * *